United States Patent
Landis (10) Patent No.: US 9,170,482 B2
(45) Date of Patent: Oct. 27, 2015

(54) TRIMMING OF DUMMY FILL SHAPES HOLES TO AFFECT NEAR-NEIGHBOR DUMMY FILL SHAPES WITH BUILT-IN OPTICAL PROXIMITY CORRECTIONS FOR SEMICONDUCTOR APPLICATIONS

(71) Applicant: INTERNATIONAL BUSINESS MACHINES CORPORATION, Armonk, NY (US)

(72) Inventor: Howard S. Landis, Underhill, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 14/231,913

(22) Filed: Apr. 1, 2014

(65) Prior Publication Data
US 2014/0215417 A1    Jul. 31, 2014

Related U.S. Application Data

(62) Division of application No. 13/353,035, filed on Jan. 18, 2012, now Pat. No. 8,739,078.

(51) Int. Cl.
| | |
|---|---|
| *G06F 17/50* | (2006.01) |
| *G03F 1/36* | (2012.01) |
| *G03F 7/20* | (2006.01) |
| *G03F 1/44* | (2012.01) |

(52) U.S. Cl.
CPC .............. *G03F 1/36* (2013.01); *G06F 17/5068* (2013.01); *G03F 1/44* (2013.01); *G03F 7/705* (2013.01); *G03F 7/70441* (2013.01)

(58) Field of Classification Search
CPC ......... G03F 1/36; G03F 1/44; G03F 7/70441; G06F 17/5068

USPC ....................................................... 716/51–55
See application file for complete search history.

(56) References Cited

U.S. PATENT DOCUMENTS

| | | | |
|---|---|---|---|
| 5,453,959 A | 9/1995 | Sakuta et al. | |
| 5,671,152 A | 9/1997 | Lavin et al. | |
| 6,022,644 A | 2/2000 | Lin et al. | |
| 6,567,964 B2 * | 5/2003 | Shin et al. | 716/55 |
| 6,596,597 B2 | 7/2003 | Furukawa et al. | |
| 6,611,045 B2 | 8/2003 | Travis et al. | |
| 6,839,890 B2 | 1/2005 | Sugita et al. | |
| 6,924,429 B2 | 8/2005 | Kasai et al. | |

(Continued)

FOREIGN PATENT DOCUMENTS

CN    1630032 A    6/2005

OTHER PUBLICATIONS

Tian et al., "Proximity Dummy Feature Placement and Selective Via Sizing for Process Uniformity in a Trench-First-Via-Last Dual-Inlaid Metal Process", Interconnect Technology Conference, IEEE International, 2001; 48 Pages.

*Primary Examiner* — Helen Rossoshek
(74) *Attorney, Agent, or Firm* — Michael LeStrange; Roberts Mlotkowski Safran & Cole, P.C.

(57) ABSTRACT

Near-neighbor trimming of dummy fill shapes with built-in optical proximity corrections (OPCs) for semiconductor applications is provided. A method for the near-neighbor trimming includes adding one or more hole shapes onto a semiconductor design layout comprising a plurality of design shapes. The method further includes trimming adjacent ones of the plurality of which are covered by the one or more hole shapes.

13 Claims, 6 Drawing Sheets

(56) References Cited

U.S. PATENT DOCUMENTS

| | | |
|---|---|---|
| 7,096,447 B1 | 8/2006 | Li et al. |
| 7,107,573 B2 | 9/2006 | Yamazoe et al. |
| 7,127,694 B2 * | 10/2006 | Watanabe et al. ............... 430/5 |
| 7,214,453 B2 | 5/2007 | Yamazoe et al. |
| 7,259,432 B2 | 8/2007 | Tamaru |
| 7,269,818 B2 | 9/2007 | Landis |
| 7,302,672 B2 | 11/2007 | Pack et al. |
| 7,343,582 B2 | 3/2008 | Mukherjee et al. |
| 7,353,492 B2 * | 4/2008 | Gupta et al. ................... 716/53 |
| 7,512,928 B2 | 3/2009 | Jessen et al. |
| 7,545,045 B2 | 6/2009 | Huang et al. |
| 7,547,502 B2 | 6/2009 | Kawashima |
| 7,550,235 B2 | 6/2009 | Shi et al. |
| 7,556,915 B2 | 7/2009 | Lauchlan |
| 7,574,685 B1 | 8/2009 | Dong et al. |
| 7,661,078 B1 | 2/2010 | Noice et al. |
| 7,681,166 B2 * | 3/2010 | van Adrichem et al. ...... 716/119 |
| 7,698,676 B1 | 4/2010 | Qian |
| 7,703,061 B2 | 4/2010 | Papadopoulou et al. |
| 7,721,248 B2 | 5/2010 | Landis |
| 7,774,736 B2 | 8/2010 | Broeke et al. |
| 7,814,456 B2 | 10/2010 | Gupta et al. |
| 7,846,616 B2 | 12/2010 | Schroeder et al. |
| 7,861,208 B2 | 12/2010 | Faure et al. |
| 7,887,996 B2 | 2/2011 | Liu et al. |
| 7,897,479 B2 | 3/2011 | Lin et al. |
| 7,910,266 B2 | 3/2011 | Yasuzato |
| 7,927,764 B2 | 4/2011 | Setta |
| 7,947,433 B2 | 5/2011 | Kawashima |
| 7,996,813 B2 | 8/2011 | Hatano et al. |
| 8,176,447 B2 | 5/2012 | Kumar et al. |
| 8,307,321 B2 | 11/2012 | Liu et al. |
| 8,332,797 B2 | 12/2012 | Cheng et al. |
| 8,336,003 B2 | 12/2012 | Cheng et al. |
| 8,398,874 B2 | 3/2013 | Kwon et al. |
| 8,434,041 B2 | 4/2013 | Chen et al. |
| 8,504,964 B2 | 8/2013 | Ooishi et al. |
| 8,516,428 B2 | 8/2013 | Bowers et al. |
| 8,597,860 B2 | 12/2013 | Tsai et al. |
| 8,679,729 B2 * | 3/2014 | Lee ............................... 430/319 |
| 2005/0127496 A1 | 6/2005 | Kwon et al. |
| 2005/0132306 A1 * | 6/2005 | Smith et al. ...................... 716/1 |
| 2005/0216877 A1 | 9/2005 | Pack et al. |
| 2006/0070018 A1 * | 3/2006 | Semmler ........................ 716/21 |
| 2007/0168898 A1 * | 7/2007 | Gupta et al. ..................... 716/9 |
| 2007/0184361 A1 * | 8/2007 | Misaka ............................ 430/5 |
| 2007/0281218 A1 | 12/2007 | Landis |
| 2008/0066041 A1 * | 3/2008 | Kahng et al. ................... 716/10 |
| 2008/0085457 A1 * | 4/2008 | Setta ................................. 430/5 |
| 2008/0121939 A1 * | 5/2008 | Murray et al. ................. 257/202 |
| 2009/0290401 A1 * | 11/2009 | Ouyang et al. ................... 365/51 |
| 2009/0314965 A1 | 12/2009 | Wu et al. |
| 2010/0162194 A1 | 6/2010 | Qian |
| 2011/0278679 A1 | 11/2011 | Tabata et al. |
| 2012/0017194 A1 | 1/2012 | Bagheri et al. |
| 2012/0082923 A1 | 4/2012 | Rankin |
| 2012/0148942 A1 | 6/2012 | Blatchford |
| 2012/0244694 A1 | 9/2012 | Shinohara |
| 2012/0295187 A1 | 11/2012 | Tsai et al. |

* cited by examiner

TRIMMING OF DUMMY FILL SHAPES HOLES TO AFFECT NEAR-NEIGHBOR DUMMY FILL SHAPES WITH BUILT-IN OPTICAL PROXIMITY CORRECTIONS FOR SEMICONDUCTOR APPLICATIONS

FIELD OF THE INVENTION

The invention relates to semiconductor structures and methods of manufacture and, more particularly, to near-neighbor trimming of dummy fill shapes with built-in optical proximity corrections (OPCs) for semiconductor applications.

BACKGROUND

In semiconductor applications, dummy fill shapes may be included in a semiconductor design to improve uniformity of shapes across the design. In semiconductor designs, a majority of design features may include dummy fill shapes. Uniform local shapes and densities facilitate manufacturing processes, such as, for example, Chemical Mechanical Polishing (CMP). To enable robust photolithographic rendering, small dummy shapes may require processing for optical proximity correction (OPC) and optical rules checking (ORC) before the shapes are rendered on a lithography mask and printed in a photoresist on a wafer.

For advanced semiconductor technologies, if a periodicity (i.e., a width of a feature plus a space between features) required for dummy fill shapes of a semiconductor design is small and/or similar to a pitch for other design features, the dummy shapes may not be robustly rendered in a photoresist when corresponding features on the lithography mask include simply desired or "target" shapes. For example, shapes which are isolated (e.g., separated) from other shapes tend to print differently (e.g., be smaller in size) than shapes which are nested or semi-nested (e.g., closely placed) to each other. This effect can be counteracted by OPC operations, which make use of complex mathematical models for optical effects in semiconductor patterning, and apply corrections to dummy fill shapes, such that the "corrected" shapes will be rendered close to desired (target) dimensions in the photoresist on the semiconductor wafer. The need for OPC is more prevalent for small design shapes in advanced semiconductor technologies. However, OPCs may be time consuming and expensive to perform. While OPCs may be an unavoidable expense for the design features that make up functional circuitry in a semiconductor design, it is an undesirable burden for dummy fill shapes.

Accordingly, there exists a need in the art to overcome the deficiencies and limitations described hereinabove.

SUMMARY

In a first aspect of the invention, a method includes adding one or more hole shapes onto a semiconductor design layout including a plurality of design shapes. The method further includes trimming adjacent ones of the plurality of design shapes which are covered by the one or more hole shapes.

In another aspect of the invention, a method in a computer-aided design system for generating a functional design model of dummy fill shapes with built-in optical proximity corrections (OPCs) for semiconductor applications, includes generating a functional representation of a plurality of design shapes. The method further includes generating a functional representation of one or more hole shapes which partially or fully cover and trim adjacent ones of the plurality of design shapes.

In yet another aspect of the invention, a computer program product includes a computer usable storage medium having readable program code embodied in the storage medium. The computer program product includes at least one component operable to place at least one set of design shapes in a first region of a semiconductor design or test layout. The at least one component is further operable to place a plurality of sets of design shapes in a second region of the semiconductor design or test layout, the plurality of sets of design shapes being one of nested and semi-nested from each other, and the first region being isolated from the second region. The at least one component is further operable to add one or more hole shapes onto a dummy fill unit cell such that the one or more hole shapes partially or fully cover shapes in an adjacent dummy fill unit cell. The at least one component is further operable to output and save the dummy fill unit cell, and use the dummy fill unit cell in a different semiconductor design.

In another aspect of the invention, a method of making a semiconductor mask, includes replacing a first dummy fill unit cell including dummy fill target shapes with a second dummy fill unit cell including the dummy fill target shapes and one or more hole shapes, in a semiconductor design layout including a plurality of instances of the first dummy fill unit cell such that the one or more hole shapes partially or fully cover adjacent ones of the plurality of instances. The method further includes printing the plurality of instances onto the semiconductor mask based on a trimming effect of the one or more hole shapes.

In yet another aspect of the invention, a method of making a plurality of semiconductor products, includes adding one or more dummy fill unit cells onto a plurality of semiconductor design layouts, each of the plurality of semiconductor design layouts including a plurality of dummy fill unit cells, and the one or more dummy fill unit cells including one or more hole shapes fully or partially covering adjacent ones of the plurality of dummy fill unit cells. The method further includes printing the plurality of semiconductor design layouts onto a plurality of semiconductor masks, and fabricating the plurality of semiconductor products based on the plurality of semiconductor masks.

In another aspect of the invention, a design structure tangibly embodied in a machine readable storage medium for designing, manufacturing, or testing an integrated circuit is provided. The design structure includes the structures of the present invention. In further embodiments, a hardware description language (HDL) design structure encoded on a machine-readable data storage medium includes elements that when processed in a computer-aided design system generates a machine-executable representation of the structures of the present invention. In still further embodiments, a method in a computer-aided design system is provided for generating a functional design model of the structures of the present invention. The method includes generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to near-neighbor trimming of dummy fill shapes with built-in optical proximity corrections (OPCs) for semiconductor applications. The term "built-in" is intended to highlight that these features and treatments can be part of a unit cell (i.e., a smallest repeating unit) of the dummy fill shapes, and need not be calculated after a layout and/or shape-by-shape based on a local environment of each dummy fill shape, as would be the case for conventional OPC operations. In embodiments, the present invention includes structures and methods which allow small dummy fill shapes (and other shapes contemplated by the invention) with built-in OPCs to print robustly (e.g., with approximately uniform shapes, close to desired or targeted size) on a semiconductor design mask at or near a smallest pitch allowed for design shapes on the mask. In accordance with aspects of the invention, this is accomplished by generating and adding, on a semiconductor design level (e.g., a computer-simulated layout of a semiconductor design mask), hole shapes which surround a dummy fill unit cell of the dummy fill shapes. The hole shapes further fully or partially cover and trim neighboring dummy fill shapes of a neighboring dummy fill unit cell. The hole shapes are generated and added to satisfy all of the printing constraints relevant to the dummy fill shapes that are contained in optical rules checking (ORC). Advantageously, aspects of the present invention produce smaller dummy fill shapes for those nested or semi-nested (e.g., closely-placed) together, and larger dummy fill shapes for those isolated (e.g., widely separated) from each other, which is often required for robust printing of the dummy fill shapes on the mask.

In embodiments, the present invention can also include generating and adding, on a semiconductor design level (e.g., a computer-simulated layout of a semiconductor design mask), hole shapes which surround a dummy fill unit cell of the dummy fill shapes, and which cover and trim neighboring sub-resolution assist features (SRAFs) surrounding a neighboring dummy fill unit cell. The SRAFs may be used to improve printing of small, lithographically-challenging design features, such as, for example, isolated or semi-nested contacts, vias, and dummy fill shapes, in advanced semiconductor designs. However, if the SRAFs associated with one design feature are too close in proximity to another design feature, these SRAFs may negatively affect lithographic rendering of both features, e.g., the formed features may be overly large and/or inappropriately extended toward one another. Accordingly, by trimming SRAFs surrounding nested or semi-nested dummy fill shapes and leaving SRAFs surrounding isolated dummy fill shapes, the printing of the dummy fill shapes may be less negatively affected by inappropriate SRAFs and thus may be more robust.

In accordance with further aspects of the invention, hole shapes for trimming dummy fill shapes and/or SRAFs may be subsequently used for trimming similar dummy fill shapes and/or SRAFs in other semiconductor design levels. Advantageously, dummy fill shapes may be printed robustly on a semiconductor design mask without performing time consuming and expensive OPCs for each semiconductor dummy fill level and for each dummy fill shape. The printed semiconductor design mask may be subsequently used to print the dummy fill shapes on a semiconductor wafer.

Figure 1:
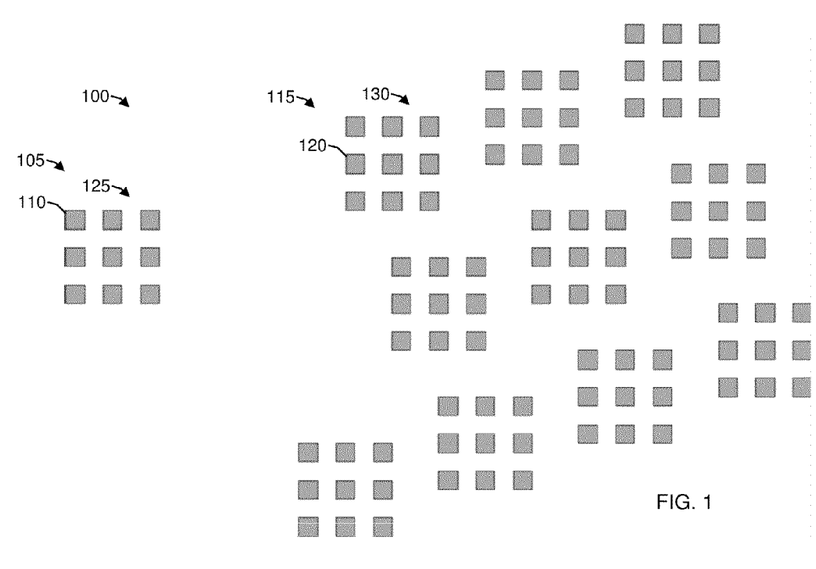
FIG. 1 graphically represents dummy fill shapes (desired or "target" shapes) in accordance with aspects of the present invention.

FIG. 1 graphically represents desired or "target" dummy fill shapes in accordance with aspects of the present invention. More specifically, a semiconductor design level 100 (e.g., a computer-simulated layout of a semiconductor design mask that is subsequently printed on the mask used to manufacture a semiconductor) is shown. In embodiments, the semiconductor design level 100 can include a diffusion, gate, metal, contact, via, and/or other type of semiconductor design level. The semiconductor design level 100 may include a first region 105 of one or more dummy fill shapes 110, and a second region 115 of one or more dummy fill shapes 120. Each of the dummy fill shapes 110, 120 may be, e.g., square in shape, and may include metal when formed on a wafer. In this example, a unit cell for the dummy fill shapes 110, 120 includes a 3×3 array of dummy fill shapes. Instead of the 3×3 array of square dummy fill shapes 110, 120, the regions 105, 115 may include one or more other dummy fill shapes or features, such as, for example, bars, lines, polygons, etc.

In embodiments, the first region 105 can include a single 3×3 set of the dummy fill shapes 110, although other dimensions are contemplated by the invention. The 3×3 set may be considered a dummy fill unit cell 125. The dummy fill unit cell 125 may be lithographically-isolated (widely separated from) from the second region 115, which may include a plurality of 3×3 sets of the dummy fill shapes 120, although other dimensions are contemplated by the invention. The plurality of 3×3 sets may be considered dummy fill unit cells 130. An edge of the isolated dummy fill unit cell 125 may be approximately 0.65 µm to 1 µm away from an edge of one of the dummy fill unit cells 130.

In contrast to the single dummy fill unit cell 125, in embodiments, the dummy fill unit cells 130 can be semi-isolated from each other (e.g., nested together as smallest square repeat units possible), and may be separated from each other by, e.g., a minimum space allowed (e.g., approximately 80 nm-200 nm, although other ranges are contemplated by the invention). Each of the dummy fill shapes 110, 120 may be a same size (e.g., approximately 80 nm) as a via in the semiconductor design level 100. A space between adjacent dummy fill shapes in each of the dummy fill unit cells 125, 130 may be equal to a minimum space allowed, e.g., approximately 80 nm.

Figure 2:
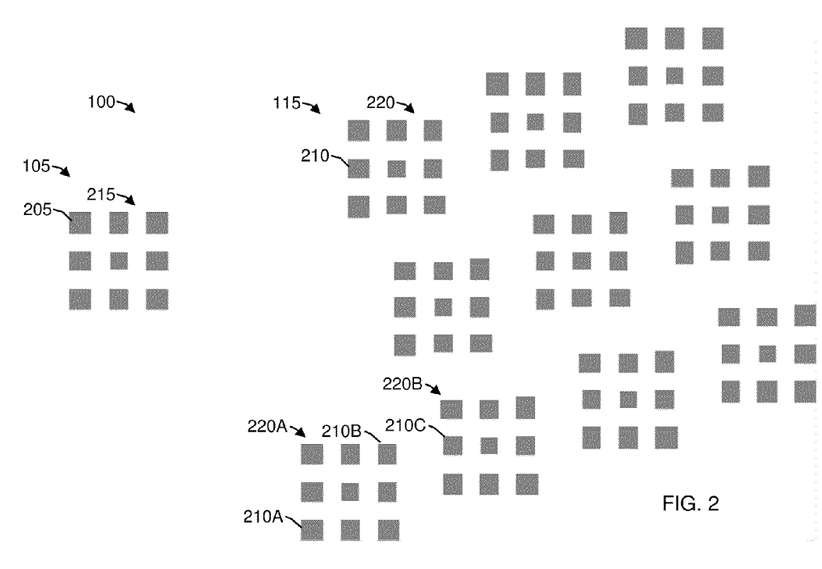
FIG. 2 graphically represents optical proximity corrected (OPC) dummy fill shapes in accordance with aspects of the present invention.

FIG. 2 graphically represents optical proximity corrected dummy fill shapes. More specifically, on the semiconductor design level 100 (e.g., a computer-simulated layout of a semiconductor design mask that is subsequently printed on the mask used to manufacture a semiconductor), the dummy fill shapes of the regions 105, 115 are optical proximity corrected based on a local environment (e.g., the region 105 or 115)

around each of the dummy fill shapes. As a result, optical proximity corrected dummy fill shapes 205 and 210 in the regions 105, 115, respectively, are formed. In embodiments, optical proximity correction (OPC) is a photolithography enhancement technique used to compensate for image errors due to diffraction or process effects. The OPC corrects these errors by moving edges or adding extra polygons to a pattern written on a photomask, based on the local environment of each shape.

Using conventional OPC, the dummy fill shapes 205 associated with a dummy fill unit cell 215 of the optical proximity corrected dummy fill shapes 205 (e.g., isolated features) may be different in shape than a resulting plurality of 3×3 sets or dummy fill unit cells 220 of the optical proximity corrected dummy fill shapes 210 (e.g., nested or partially-nested features). For example, the isolated features (e.g., a center dummy fill shape of the dummy fill unit cell 215) may be smaller in shape than the nested features (e.g., dummy fill shapes in corners of the dummy fill unit cells 220). This may be due to the isolated features being far enough in distance away from the other nearby features so that there is no lithographic interaction and/or negligible impact between the isolated and nested features. In another example, design features (e.g., a dummy fill shape 210A in a dummy fill unit cell 220A) which do not have a near-neighbor design feature outside of the 3×3 unit cell may be larger in shape than design features (e.g., a dummy fill shape 210B in the dummy fill unit cell 220A) that do have a near-neighbor design feature in an adjacent 3×3 unit cell (e.g., a dummy fill shape 210C in an adjacent dummy fill unit cell 220B). In this example, the neighboring design features are close enough in distance to each other such that these features affect each other during printing in a photoresist on a semiconductor wafer. Due to this near-neighbor interaction, the size of corresponding mask features must be different (compared to the size of more isolated features such as the dummy fill unit cell 210A), in order that the printed features in the photoresist and the subsequent shapes on the semiconductor wafer resolve appropriately, e.g., with approximately uniform shapes, close to the desired or targeted size.

Isolated dummy features can vary with respect to nested dummy features when dimensional constraints of features (e.g., a space between the features) for the semiconductor design level 100 are tight or small and printed on a semiconductor mask. For example, the dummy fill shape 205 may be different in shape than the other dummy fill shapes in the unit cell 215, and different from dummy fill shape 210 and the other dummy fill shapes in the unit cell 220, when the dummy fill shapes 205, 210 are sized to be as small, or nearly as small, as the smallest design features for the semiconductor design level 100. Dummy fill shapes in a semiconductor design may be expected to be approximately uniform in shape, so the benefits afforded by OPC treatment are valuable. However, OPC is an expensive, time consuming process.

Figure 3:
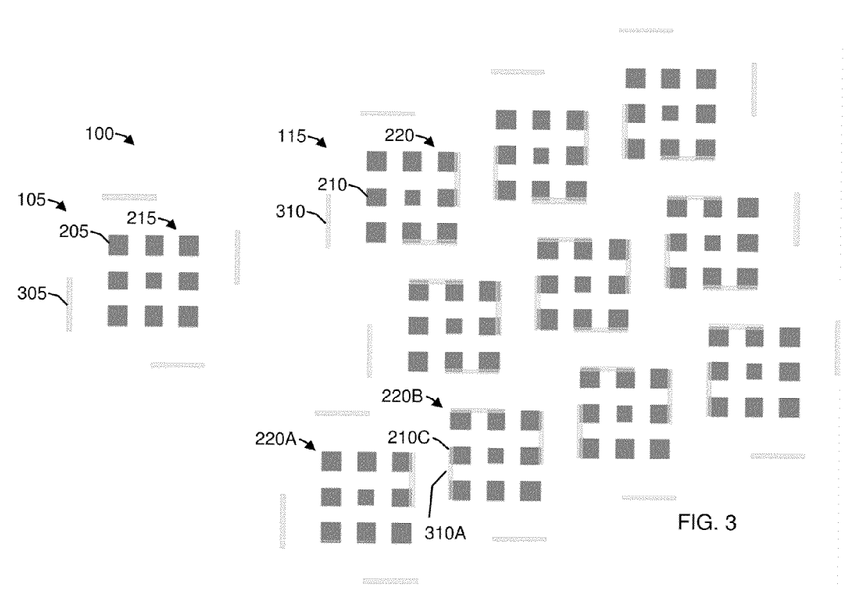
FIG. 3 graphically represents the OPC dummy fill shapes and hole shapes in accordance with aspects of the present invention.

FIG. 3 graphically represents optical proximity corrected dummy fill shapes and hole shapes in accordance with aspects of the present invention. More specifically, the semiconductor design level 100 (e.g., a computer-simulated layout of a semiconductor design mask that is subsequently printed on the mask used to manufacture a semiconductor) is shown. To enable approximately uniform printing of dummy fill shapes in the semiconductor design level 100 with tight dimensional constraints, one or more hole shapes 305 can be included in the dummy fill unit cell 215 and added to the semiconductor design level 100 and/or another semiconductor design level, e.g., an intermediate semiconductor design layer. In embodiments, the hole shapes 305 may be added or constructed to surround the dummy fill unit cell 215 of the optical proximity corrected dummy fill shapes 205 in the first region 105. For example, a space between each edge of the dummy fill unit cell 215 and each of the hole shapes 305 may be approximately 160 nm, although other distances are contemplated by the invention.

In embodiments, the hole shapes 305 can be a static or fixed, additional set of OPCs. That is, the hole shapes 305 may be added to the dummy fill unit cell 215, in such a way that the hole shapes 305 act to cover and trim (e.g., remove portions of) dummy fill unit cells which are nearest neighbors (and/or second-nearest neighbors) to the dummy fill unit cell 215 surrounded by the hole shapes 305, but to not interact with more distant dummy fill instances. In this case, since the dummy fill unit cell 215 is isolated from other dummy fill unit cells (e.g., the dummy fill unit cells 220), the hole shapes 305 are not close enough in proximity to the other dummy fill unit cells to affect such dummy fill unit cells.

In accordance with further aspects of the invention, one or more hole shapes 310 can be generated and added to the semiconductor design level 100 and/or another semiconductor design level. More specifically, the hole shapes 310 may be added or placed to surround the dummy fill unit cells 220 of the optical proximity corrected dummy fill shapes 210 in the second region 115. For example, a space between each edge of the dummy fill unit cells 220 and each of the hole shapes 310 may be approximately 160 nm, although other distances are contemplated by the invention. The hole shapes 310 may be a static or fixed, additional set of OPCs of the dummy fill unit cells 220. That is, the hole shapes 310 may be added to cover and trim (e.g., remove portions of) dummy fill unit cells which are nearest neighbors (and/or second-nearest neighbors) to a dummy fill unit cell surrounded by the hole shapes 310. The adding of the hole shapes 310 may include determining, for the given dummy fill shapes 210, sizes of the dummy fill shapes 210 and how much of the dummy fill shapes 210 need to be trimmed, and placing the hole shapes 310 in the semiconductor design layer 100 such that the dummy fill shapes 210 are properly trimmed for, e.g., uniformity in shape. The hole shapes 310 are generated and added to satisfy all of the printing constraints relevant to the dummy fill shapes 210 that are contained in optical rules checking (ORC).

For example, hole shapes 310A surround the dummy fill unit cell 220A, and cover and trim dummy fill unit cells (e.g., the dummy fill unit cell 220B at, for example, the dummy fill shape 210C) which are neighbors to the dummy fill unit cell 220A. The hole shapes 310 allow each of the dummy fill unit cells 220 to be trimmed on each side which is adjacent to one or more near-neighbor design features, such as the dummy fill shapes 210, and which is covered by the hole shapes 310. The trimming may require that a process for manufacturing a mask of a semiconductor design, be able to print the dummy fill shapes 210 on the mask, except for regions of the dummy fill shapes 210 which are covered by the hole shapes 310. In alternative or additional embodiments, the dummy fill shapes 210 may be trimmed at the regions which are covered by the hole shapes 310 in the computer-simulated layout of the semiconductor design mask before the design is provided to a mask manufacturing facility.

Advantageously, the static set of the hole shapes 310 can form further OPCs of the dummy fill shapes 210 on the semiconductor level 100 and/or the mask that more closely approximate ideal shapes of the dummy fill shapes 210 in nested or intermediately-nested local environments and in an isolated local environment. That is, the trimmed dummy fill shapes 210 may be more approximately uniform in shape with each other and the isolated dummy fill shapes 205. Accordingly, dummy fill shapes (or other features) may be robustly printed onto a semiconductor design mask with tight dimensional constraints (e.g., a small pitch between the dummy fill shapes), which is an improvement over more-limited, large dummy fill structures not requiring shape-by-shape OPC treatment in the state of the art. The semiconductor design mask with approximately uniform dummy fill shapes may subsequently be used to manufacture a semiconductor product, e.g., to print the semiconductor design mask onto a semiconductor wafer. In addition, the static set of the hole shapes 305, 310 matched with dummy fill shapes 205, 210, respectively, may subsequently be used in other semiconductor design levels and/or semiconductor design masks that have similar manufacturing requirements. As such, aspects of the present invention allow for trimming dummy fill shapes in many semiconductor designs iteratively and automatically with an already-generated single set of dummy fill and hole shapes, instead of computationally with the time-consuming and expensive traditional OPC for each of the semiconductor designs.

Figure 4:
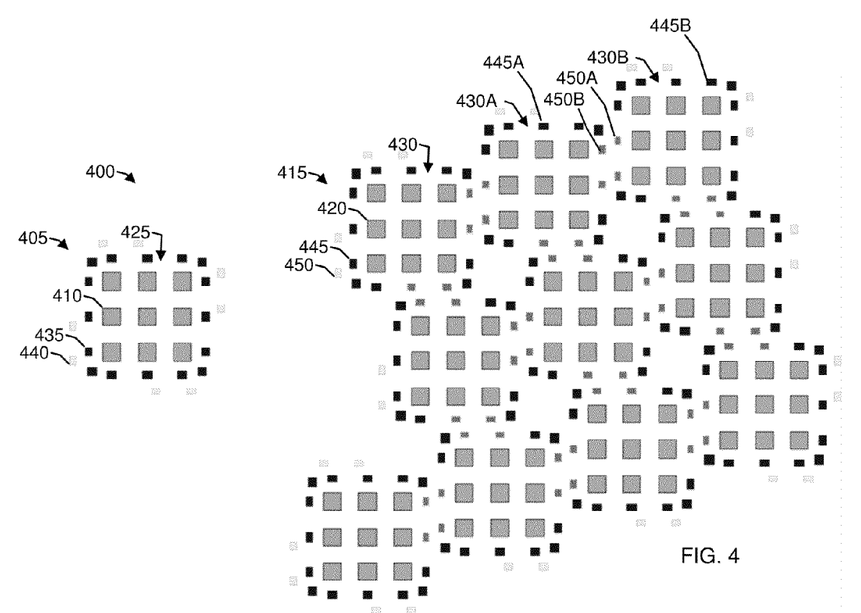
FIG. 4 graphically represents the dummy fill shapes, sub-resolution assist features (SRAFs), and other hole shapes in accordance with aspects of the present invention.

FIG. 4 graphically represents dummy fill shapes, sub-resolution assist features (SRAFs), and hole shapes in accordance with aspects of the present invention. More specifically, a semiconductor design level 400 (e.g., a computer-simulated layout of a semiconductor design mask that is subsequently printed on the mask used to manufacture a semiconductor) is shown. In embodiments, the semiconductor design level 400 can include a diffusion, gate, metal, contact, via, deep-trench capacitor and/or other type of semiconductor design level. The semiconductor design level 400 may include a first region 405 of one or more dummy fill shapes 410, and a second region 415 of one or more dummy fill shapes 420. Each of the dummy fill shapes 410, 420 may be, e.g., square in shape, and may include metal when formed on a wafer. Instead of the square dummy fill shapes 410, 420, the first region 405 and the second region 415 may include one or more other design shapes or features, such as, for example, extensions, lines, etc.

In embodiments, the first region 405 can include a single 3×3 set of the dummy fill shapes 410, although other features and dimensions are contemplated by the invention. The 3×3 set may be considered a dummy fill unit cell 425. The dummy fill unit cell 425 may be isolated from the second region 415, which may include a plurality of 3×3 sets of the dummy fill shapes 420, although other dimensions are contemplated by the invention. The plurality of 3×3 sets may be considered dummy fill unit cells 430. An edge of the dummy fill unit cell 425 may be approximately 0.65 µm to 1 µm away from an edge of one of the dummy fill unit cells 430.

In contrast to the single dummy fill unit cell 425, in embodiments, the dummy fill unit cells 430 can be semi-isolated from each other (e.g., nested together as smallest square repeat units possible), and can be separated from each other by, e.g., a minimum space allowed (e.g., approximately 160 nm-200 nm, although other ranges are contemplated by the invention). Each of the dummy fill shapes 410, 420 may be a same size (e.g., approximately 80 nm) as a via in the semiconductor design level 400. A space between adjacent dummy fill shapes in each of the dummy fill unit cells 425, 430 may be equal to a minimum space allowed, e.g., approximately 80 nm.

In accordance with further aspects of the invention, the first region 405 can further include one or more SRAFs 435 surrounding the dummy fill unit cell 425 which is sufficiently isolated along its edges to accommodate the SRAFs 435. In embodiments, SRAFs 435 may be used with or without optimal proximity corrections (OPCs) (e.g., described in FIG. 2) to improve printing of small, lithographically-challenging design features, such as, for example, contacts, vias, and dummy fill shapes in advanced semiconductor designs, onto a wafer. For example, the dummy fill unit cell 425 may be surrounded by the sixteen SRAFs 435 to improve printing of the dummy fill shapes 410 onto a wafer. More specifically, during a photolithography process for manufacturing a mask of the semiconductor design level 400, the SRAFs 435 may form openings in the mask where light may get through. While these openings may be too small to print and develop on a wafer, the SRAFs 435 positively affect the forming of the dummy fill shapes 410 on the wafer to be a desired size.

However, if SRAFs (e.g., the SRAFs 435) are too close in proximity, these SRAFs can allow too much light to get through a mask during a photolithography process for manufacturing a wafer of a semiconductor design level. In this case, the SRAFs may negatively affect formation of dummy fill shapes (e.g., the dummy fill shapes 410) on the wafer. For example, the formed dummy fill shapes may be overly long or extended due to the SRAFs, or the SRAFs themselves may inappropriately resolve in the photoresist and be inappropriately formed on the semiconductor wafer.

In embodiments, to enable approximately uniform formation of dummy fill shapes in a semiconductor design level with tight dimensional constraints, one or more hole shapes 440 can be generated and added to the semiconductor design level 400 and/or another semiconductor design level, e.g., an intermediate semiconductor design layer. The hole shapes 440 may be added or placed to surround the dummy fill unit cell 425 and the SRAFs 435. For example, a space between each edge of the dummy fill unit cell 425 and each of the hole shapes 440 may be approximately 160 nm, although other distances are contemplated by the invention. The hole shapes 440 may be a static or fixed. additional set of OPCs. That is, the hole shapes 440 may be added to cover and trim (e.g., remove) SRAFs which surround other dummy fill unit cells (e.g., the dummy fill unit cells 430). In this case, since the dummy fill unit cell 425 is isolated from other dummy fill unit cells, the hole shapes 440 are not close enough in proximity to SRAFs surrounding the other dummy fill unit cells to affect such SRAFs.

In accordance with further aspects of the invention, the second region 415 can further include one or more SRAFs 445 surrounding the dummy fill unit cells 430 which are sufficiently isolated along their edges to accommodate the SRAFs 445. In embodiments, SRAFs 445 may be used with or without OPCs (e.g., described in FIG. 2) to improve printing of small, lithographically-challenging design features, such as, for example, contacts, vias, and dummy fill shapes in advanced semiconductor designs. For example, the dummy fill unit cells 430 may be surrounded by the SRAFs 445 to improve forming of the dummy fill shapes 420. In addition, the second region 415 may include one or more hole shapes 450 generated and added to the semiconductor design level 400 and/or another semiconductor design level. More specifically, the hole shapes 450 may be added or placed to surround the dummy fill unit cells 430 and the SRAFs 445. For example, a space between each edge of the dummy fill unit cells 430 and each of the hole shapes 450 may be approximately 160 nm, although other distances are contemplated by the invention.

In embodiments, the hole shapes 450 can be a static or fixed, additional set of OPCs of the SRAFs 445. That is, the hole shapes 450 may be added to cover and trim (e.g., remove) an SRAF of a dummy fill unit cell that is nearest neighbor (and/or second-nearest neighbor) to another SRAF of another dummy fill unit cell. The adding of the hole shapes 450 may include determining, for the given SRAFs 445, sizes of the SRAFs 445 and which of the SRAFs 445 need to be trimmed, and placing the hole shapes 450 in the semiconductor design level such that the SRAFs 445 are properly trimmed to avoid negative effects in photolithographic processes. For example, hole shapes 450A surround a dummy fill unit cell 430A, and cover and trim SRAFs 445B which surround a dummy fill unit cell 430B and are neighbors to SRAFs 445A of the dummy fill unit cell 430A. Hole shapes 450B surround the dummy fill unit cell 430B, and cover and trim the SRAFs 445A which surround the dummy fill unit cell 430A and are neighbors to the SRAFs 445B of the dummy fill unit cell 430B.

In accordance with further aspects of the invention, the hole shapes 450 can be generated and added to satisfy all of the printing constraints relevant to the dummy fill shapes 420 that are contained in optical rules checking (ORC). Accordingly, each of the hole shapes 450 may trim a SRAF of a dummy fill unit cell that is adjacent to one or more near-neighbor design features, such as another SRAF of another dummy fill unit cell, and that is covered by one of the hole shapes 450. The trimming may require that a process for manufacturing a mask of a semiconductor design, be able to print the SRAFs 445, except for the SRAFs 445 which are covered by the hole shapes 450. The hole shapes 450 may be combined with the hole shapes 310 in FIG. 3 to cover and trim not only the SRAFs 445 but also the dummy fill shapes 420, at a same time, to maximize uniformity in the dummy fill shapes 420.

Figure 5:
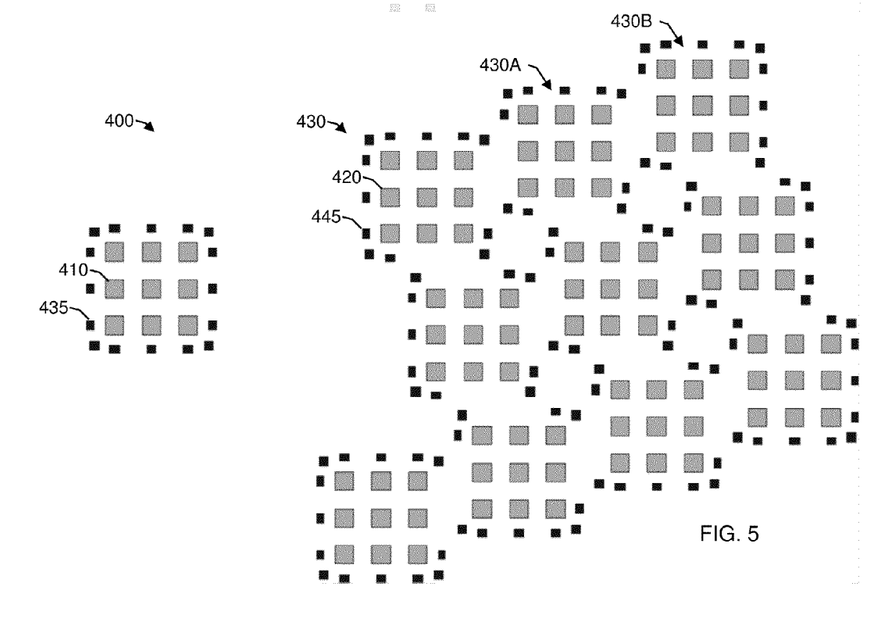
FIG. 5 graphically represents the dummy fill shapes and the trimmed SRAFs in accordance with aspects of the present invention.

FIG. 5 graphically represents dummy fill shapes and trimmed SRAFs in accordance with aspects of the present invention. More specifically, the semiconductor design level 400 is shown with some of the SRAFs 445 in the second region 415 trimmed or removed by hole shapes, e.g., the hole shapes 450 in FIG. 4. For example, the nested SRAFs (e.g., the SRAFs 445A, 445B in FIG. 4) between the dummy fill unit cell 430A and the dummy fill unit cell 430B may be trimmed by the hole shapes (e.g., the hole shapes 450A, 450B in FIG. 4). The trimming removes negative effects of such nested SRAFs on forming the dummy fill shapes 420 on the mask of the semiconductor design level 400. While the dummy fill shapes 410 (e.g., isolated features) may be surrounded by the sixteen SRAFs 435, each of the dummy fill shapes 420 (e.g., nested features) are surrounded by the fewer SRAFs 445 due to trimming of the SRAFs 445.

Advantageously, a static set of hole shapes and dummy fill shapes including SRAF features on a semiconductor design layout can be used to print a semiconductor mask. The dummy fill shapes and SRAFs may more closely approximate ideal shapes of the dummy fill shapes in nested or intermediately-nested local environments and in an isolated local environment, such as those that could be obtained from time consuming and expensive traditional OPC treatments of dummy fill shapes. In addition, a unit cell of the dummy fill shapes with SRAFs and matched hole shapes may subsequently be used to populate other semiconductor design layouts that have similar manufacturing requirements. Accordingly, aspects of the present invention allow for utilization of dummy fill shapes with built-in OPC treatments including built-in trimming of SRAFs in many semiconductor designs iteratively and automatically with a previously-generated single dummy fill unit cell. As such, aspects of the present invention allows for the robust printing of approximately uniform dummy fill shapes in any local environment, e.g., nested, semi-nested, or isolated, and with any fine pitch.

In accordance with further aspects of the invention, it may be advantageous to place SRAFs on a different design level than one used for dummy fill shapes, and/or to place hole shapes intended to trim SRAFs on a different design level than one used for hole shapes intended to trim dummy fill shapes. In this way, hole shapes in a dummy fill unit cell can be arranged for independent trimming of SRAF and dummy fill features. This independent trimming can be advantageous by allowing for more flexibility in the arrangement of hole and SRAF shapes.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
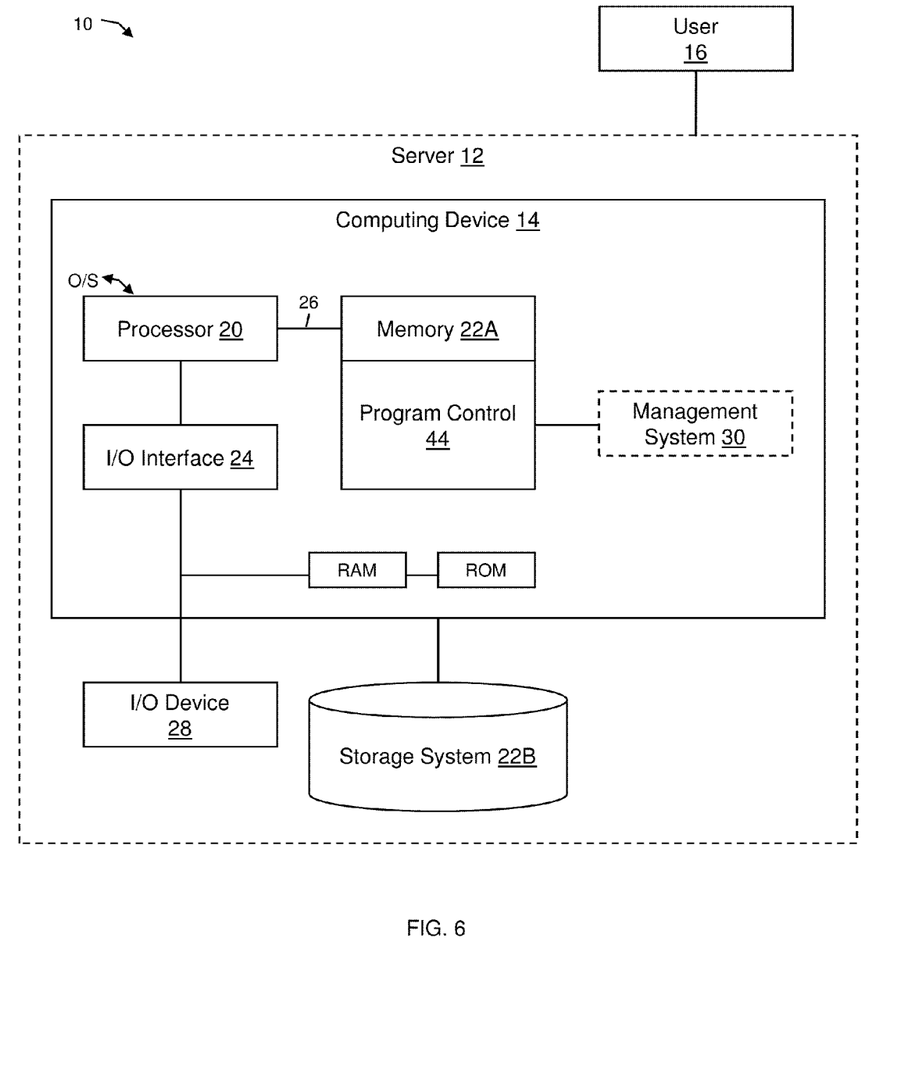
FIG. 6 is representative of a system implementing aspects of the present invention.

FIG. 6 shows an illustrative environment 10 for managing the processes in accordance with the invention. To this extent, the environment 10 includes a server or other computing system 12 that can perform the processes described herein. In embodiments, the server 12 may include any mobile computing device, such as a mobile phone, a laptop, a video camera, etc. In particular, the server 12 includes a computing device 14. The computing device 14 can be resident on a network infrastructure or computing device of a third party service provider (any of which is generally represented in FIG. 6).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with an external I/O device/resource 28 and the storage system 22B. For example, the I/O device 28 can comprise any device that enables an individual (e.g., a user 16) to interact with the computing device 14 (e.g., user interface) or any device that enables the computing device 14 to communicate with one or more other computing devices (e.g., of the user 16) using any type of communications link. The external I/O device/resource 28 may be for example, a handset, keyboard, etc.

In general, the processor 20 executes computer program code (e.g., program control 44), which can be stored in the memory 22A and/or storage system 22B. Moreover, in accordance with aspects of the invention, the program control 44 controls a management system 30, e.g., the processes described herein. The management system 30 can be implemented as one or more program code in the program control 44 stored in memory 22A as separate or combined modules. Additionally, the management system 30 may be implemented as separate dedicated processors or a single or several processors to provide the function of this tool. Moreover, it should be understood by those of ordinary skill in the art that the management system 30 is used as a general descriptive term for providing the features and/or functions of the present invention.

In embodiments, the management system 30 generates a semiconductor design level, e.g., a computer-simulated layout of a semiconductor design mask that is subsequently printed on the mask. The printed mask can be used to manufacture a semiconductor product, e.g., printed on a semiconductor wafer through conventional lithographic processes. The management system 30 may allow small dummy fill shapes (and other shapes contemplated by the invention) with optical proximity corrections (OPCs) to print robustly (e.g., with approximately uniform shapes) on the mask at or near a smallest pitch allowed for shapes on the mask.

In accordance with further aspects of the invention, to accomplish this, the management system 30 can generate and add, on the semiconductor design level (e.g., the semiconductor design level 100), a dummy fill unit cell including the dummy fill shapes, hole shapes, and/or sub-resolution assist features (SRAFs). The hole shapes further cover and trim neighboring dummy fill shapes and/or SRAFS of a neighboring dummy fill unit cell. Advantageously, the management system 30 allows for the production of smaller dummy fill shapes for those nested or semi-nested (e.g., closely-placed) together, and larger dummy fill shapes for those isolated (e.g., separated) from each other, which is often required for robust printing of the dummy fill shapes on the mask.

While executing the computer program code, the processor 20 can read and/or write data to/from memory 22A, storage system 22B, and/or I/O interface 24. The program code executes the processes of the invention, for example, functions of the management system 30, e.g., managing one or more dummy fill shapes placed on a subject circuit of a design structure. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices (e.g., of the user 16) external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 7:
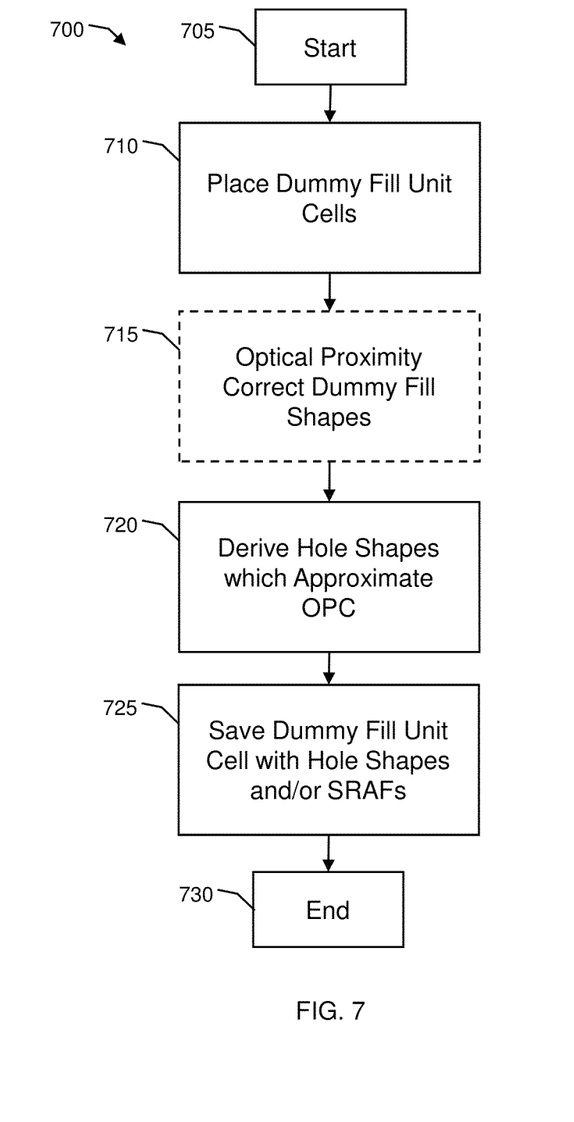
FIG. 7 is a flow diagram implementing steps in accordance with aspects of the present invention.

FIG. 7 shows an exemplary flow for performing aspects of the present invention. The steps of FIG. 7 may be implemented in the environment of FIG. 6, for example. The flowchart and block diagram in the Figure illustrate the architecture, functionality, and operation of possible implementations of systems, methods and computer program products according to various embodiments of the present invention. In this regard, each block in the flowchart or block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 6. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 7 depicts an exemplary flow for a process 700 for generating a set of hole shapes which accomplish near-neighbor trimming of dummy fill shapes and/or SRAFs in accordance with aspects of the present invention. The process 700 produces a result equivalent or largely similar to results that would be obtained through conventional application of optical proximity corrections (OPCs) to dummy fill target shapes in semiconductor applications. In embodiments, the process 700 may be performed by the management system 30 in FIG. 6. At step 705, the process starts. At step 710, the management system places dummy fill unit cells of dummy fill target shapes into a semiconductor design layout or test layout. The dummy fill target unit cells must be placed in such a way that spacing to, and orientation of, adjacent and nearby dummy fill unit cells are fixed and repeatable. In embodiments, one or more of the dummy fill unit cells must be isolated from other unit cells; one or more of dummy fill unit cells must be in nested locations (i.e., completely surrounded by other dummy fill unit cells in nearest-neighbor locations); and one or more of dummy fill unit cells must be in semi-nested locations (i.e., surrounded by other dummy fill unit cells in nearest-neighbor locations in one or two directions, but not in all directions).

At step 715, in optional embodiments, the management system may optical proximity correct the dummy fill shapes using traditional OPC processes, resulting in the dummy fill shapes which are each adjusted based on their local environment. Depending on lithographic requirements for a mask layer, the result of step 715 may include SRAFs associated with the dummy fill shapes. At step 720, the management system adds the OPC result for an isolated instance of the dummy fill unit cells, hereafter referred to as isolated-OPC dummy shapes, and adds (e.g., derives) one or more hole shapes to the isolated dummy fill unit cell. The isolated-OPC dummy shapes may be exactly the same as the result from step 715 for the isolated dummy fill unit cell, or may be similar to but not exactly the same as the result from step 715. Further, the isolated-OPC dummy shapes may include SRAF shapes which may be exactly the same as the SRAF shapes resulting from step 715 for the isolated dummy fill unit cell, or may be similar to but not exactly the same as the SRAF result from step 715. In embodiments, the adding of shapes to the isolated dummy fill unit cell may include placing the hole shapes such that the isolated-OPC dummy shapes (possibly including SRAFs) in adjacent (nearest-neighbor) and/or nearby (second or third nearest neighbor) dummy fill unit cells may be trimmed. The placement of the hole shapes in the isolated dummy fill unit cell is arranged such that the trimming of dummy shapes in adjacent and/or nearby dummy fill unit cells results in a set of mask shapes that closely or exactly resembles the result of step 715.

At step 725, the management system outputs and saves the dummy fill unit cell including the isolated-OPC dummy shapes (possibly including SRAFs) and the one or more added hole shapes. The result of step 725 is a dummy fill unit cell containing dummy fill target shapes, isolated-OPC dummy shapes (possibly including SRAFs), and one or more hole shapes. This dummy fill unit cell can then be used to replace the dummy fill unit cell from step 710 in any other semiconductor layout which would make use of similar dummy fill shapes. Further, mask shapes resulting from the combination of isolated-OPC dummy shapes and hole shapes in this other semiconductor layout will be similar to the result of shape-by-shape conventional OPC for the dummy fill, but without the time and expense associated with conventional OPC for dummy fill. At step 730, the process ends.

In embodiments, hole shapes added to a dummy fill unit cell do not act to trim functional design shapes (as opposed to dummy fill shapes), and do not act to trim an OPC result for functional design shapes which would appear on a same mask, possibly including SRAFs associated with the functional design shapes. The hole shapes in the dummy fill unit cell can be inhibited from trimming such an OPC result for the functional design shapes by insuring that dummy fill unit cells are not placed close to the functional design shapes. Alternatively, this may be accomplished by placing hole shapes on a design level which is defined to not affect the design level or levels that contain such an OPC result. Other methods for insuring that hole shapes do not adversely affect the printing of functional design shapes are also contemplated by this invention.

Figure 8:
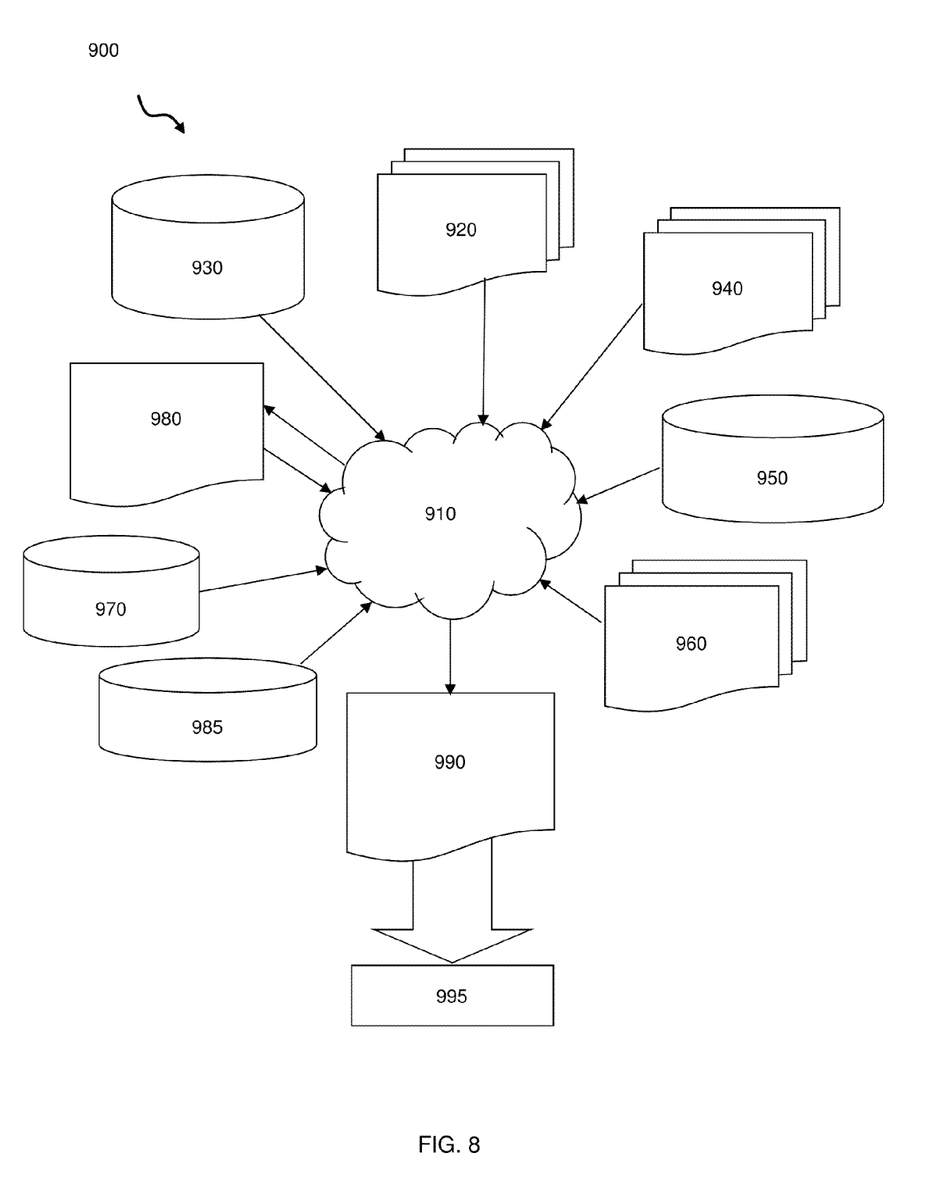
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A computer program product comprising a computer usable storage medium having readable program code embodied in the storage medium, the computer program product includes at least one component operable to:
   place at least one set of design shapes in a first region of a semiconductor design or test layout;
   place a plurality of sets of design shapes in a second region of the semiconductor design or test layout, the plurality of sets of design shapes being one of nested and semi-nested from each other, and the first region being isolated from the second region;
   wherein the at least one set of design shapes in the first region and the plurality of sets of design shapes in the second region comprise dummy fill unit cells;
   adjust one of the dummy fill unit cells by adding one or more hole shapes onto the dummy fill unit cell such that the one or more hole shapes partially or fully cover and trim shapes in an adjacent one of the dummy fill unit cells;
   output the dummy fill unit cell for use in the semiconductor design or test layout;
   save the dummy fill unit cell for use in a different semiconductor design; and
   use the dummy fill unit cell in the different semiconductor design.

2. The computer program product of claim 1, wherein the dummy fill unit cell comprises at least one of one or more dummy fill shapes and one or more isolated-optical proximity correction (OPC) dummy shapes.

3. The computer program product of claim 1, wherein the dummy fill unit cell comprises at least one of one or more sub-resolution assist features (SRAFs).

4. The computer program product of claim 3, wherein the one or more hole shapes surround the dummy fill unit cell and the one or more SRAFs surround the dummy fill unit cell, and the one or more hole shapes further cover and trim the one or more SRAFs surrounding the adjacent dummy fill unit cell.

5. The computer program product of claim 4, wherein the one or more hole shapes that cover and trim the one or more SRAFs are placed on a first semiconductor design level and the one or more hole shapes that cover and trim the adjacent dummy fill unit cell are placed on a second semiconductor design level.

6. The computer program product of claim 1, wherein the hole shapes are added to satisfy all of a printing constraints relevant to the dummy fill unit cell that are contained in a optical rules checking.

7. The computer program product of claim 1, wherein outputting the dummy fill unit cell for use in the semiconductor design or test layout includes optical proximity correction to compensate for image errors due to diffraction or process effects by moving edges or adding extra polygons to a pattern written on a photomask, based on a local environment of each shape.

8. The computer program product of claim 1, wherein:
   the one or more dummy fill unit cells are arranged in a first dummy fill unit cell and a second dummy fill unit cell;
   the one or more hole shapes comprises a first set of hole shapes around the first dummy fill unit cell, and a second set of hole shapes around the second dummy fill unit cell; and
   a hole shape in the first set of hole shapes fully or partially covers a dummy fill shape in the second dummy fill unit cell.

9. The computer program product of claim 1, wherein the saved dummy fill unit cell contains dummy fill target shapes, isolated-optical proximity correction (OPC) dummy shapes, and the one or more hole shapes.

10. The computer program product of claim 9, wherein the using the dummy fill unit cell in the different semiconductor design comprises replacing a different dummy fill unit cell in the different semiconductor design with the saved dummy fill unit cell.

11. A method of making a plurality of semiconductor products, comprising:
- adding one or more dummy fill unit cells onto a plurality of semiconductor design layouts, each of the plurality of semiconductor design layouts comprising a plurality of dummy fill unit cells, and the one or more dummy fill unit cells comprising one or more hole shapes fully or partially covering adjacent ones of the plurality of dummy fill unit cells;
- printing the plurality of semiconductor design layouts onto a plurality of semiconductor masks; and
- fabricating the plurality of semiconductor products based on the plurality of semiconductor masks.

12. The method of claim 11, wherein the printing further comprises printing exposed regions of the plurality of dummy fill unit cells onto the plurality of the semiconductor masks.

13. The method of claim 12 wherein the printing further comprises the dummy fill unit cells placed such that a spacing to, and a orientation of, adjacent dummy fill unit cells is fixed and repeatable.

* * * * *